(12) United States Patent
Hill

(10) Patent No.: US 9,490,783 B1
(45) Date of Patent: Nov. 8, 2016

(54) AREA EFFICIENT MULTI BIT FLIP FLOP TOPOLOGIES

(71) Applicant: Texas Instruments Incorporated, Dallas, TX (US)

(72) Inventor: Anthony Martin Hill, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/088,501

(22) Filed: Apr. 1, 2016

Related U.S. Application Data

(60) Provisional application No. 62/147,881, filed on Apr. 15, 2015.

(51) Int. Cl.
*H03K 19/00* (2006.01)
*H03K 3/3562* (2006.01)
*H03K 3/037* (2006.01)

(52) U.S. Cl.
CPC ........ *H03K 3/35625* (2013.01); *H03K 3/0372* (2013.01)

(58) Field of Classification Search
None
See application file for complete search history.

(56) References Cited

U.S. PATENT DOCUMENTS

| | | | | |
|---|---|---|---|---|
| 2015/0070063 A1* | 3/2015 | Gurumurthy | ...... | H03K 3/35625 327/203 |
| 2015/0318845 A1* | 11/2015 | Pasternak | ........... | G06F 17/5045 327/203 |
| 2016/0191028 A1* | 6/2016 | Das | ................... | H03K 3/35625 327/203 |

\* cited by examiner

*Primary Examiner* — Anh Tran
(74) *Attorney, Agent, or Firm* — Robert D. Marshall, Jr.; Frank D. Cimino

(57) ABSTRACT

The invention is an intelligent connection of the internal scan logic in a multi-bit flip-flop register. Individual bits in this register are connected in a serial scan chain. In this invention the serial chain is connection reuses logic between slave latches on bit n and master latches on bit n+1. This reuse reduces the number of transistors required to implement the multi-bit register. This reduction in the number of required transistors enables a consequent reduction in integrated circuit area required, thereby reducing manufacturing cost. Alternatively, the area saved using this invention may be used for other purposes. This could increase the value of the corresponding integrated circuit without increasing manufacturing costs.

13 Claims, 5 Drawing Sheets

US 9,490,783 B1

AREA EFFICIENT MULTI BIT FLIP FLOP TOPOLOGIES

CLAIM OF PRIORITY

This application claims priority under 35 U.S.C. 119(e)(1) to U.S. Provisional Application No. 62/147,881 filed Apr. 15, 2015.

TECHNICAL FIELD OF THE INVENTION

The technical field of this invention is multiple bit flip-flops that are connected in a scan chain.

BACKGROUND OF THE INVENTION

Multiple flip-flops are connected together into a single multi-bit flip-flop forming a register. In this multibit register each bit is readable and writeable independently. The individual bits in the multibit register are connected together in a serial scan chain. The prior art simply cascades bits together and shares common clock/scan generation logic. This prior art technique provides some area and power improvement (e.g., 10%) over discrete independent flip-flops.

SUMMARY OF THE INVENTION

The invention is an intelligent connection of the internal scan logic in a multi-bit flip-flop register. Individual bits in this register are connected in a serial scan chain. In this invention the serial chain is connection reuses logic between slave latches on bit n and master latches on bit n+1. This reuse reduces the number of transistors required to implement the multi-bit register. This reduction in the number of required transistors enables a consequent reduction in integrated circuit area required, thereby reducing manufacturing cost. Alternatively, the area saved using this invention may be used for other purposes. This could increase the value of the corresponding integrated circuit without increasing manufacturing costs.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
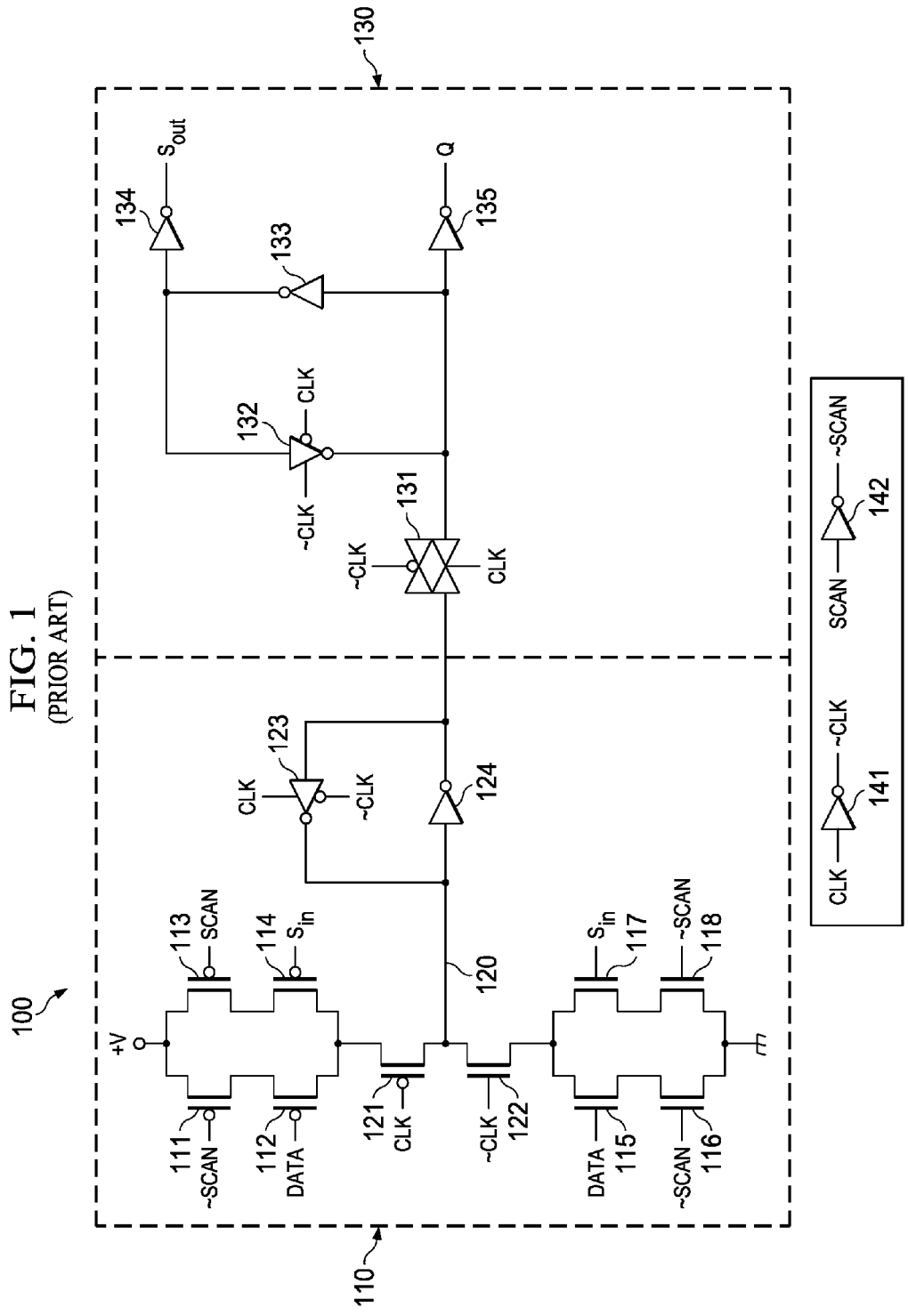
FIG. 1 illustrates the circuits of a prior art inverting master-slave flip-flop having data and scan inputs.

FIG. 1 illustrates a prior art inverting master-slave flip-flop 100 having data and scan inputs. Master-slave flip-flop 100 is divided into an input/master section 110 and a slave/output section 130. Input/master section 110 includes: an input section of FETs 111, 112, 113, 114, 115, 116, 117, 118, 121 and 121; and a master latch including clocked inverter 123 and inverter 124. Slave/output section 130 includes: pass gate 131; a slave latch having clocked inverter 132 and inverter 133; and an output section including inverters 134 and 135. Inverters 141 and 142, providing respective inverted clock and scan signals, are not part of either input/master section 110 or slave/output section 130.

The input section pulls node 120 toward the power supply +V or toward the ground depending upon the inputs. The input section receives the following signals: a data signal as an input; a $S_{in}$ signal as a scan input; normal and inverted versions of a scan input control signal Scan/~Scan; and normal and inverted clock signals Clk/~Clk. FETs 121 and 122 are either both conducting or both cut off depending on the clock phase. Master-slave flip-flop 100 operates in either a normal mode or a scan chain mode. In the normal mode Scan Enable is inactive and Scan Enable is active. FETs 103 and 108 are cut-off isolating master-slave flip-flop 100 from the $S_{in}$ signal. If the Data input signal is active, node 120 is pulled toward +V when FETs 121 and 122 are conducting. If the Data signal is inactive, node 120 is pulled toward ground when FETs 121 and 122 are conducting. In the scan node Scan Enable is active and Scan Enable is inactive. FETs 101 and 106 are cut-off isolating master-slave flip-flop 100 from the data input signal. If the $S_{in}$ input signal is active, node 120 is pulled toward +V when FETs 121 and 122 are conducting. If the $S_{in}$ signal is inactive, node 120 is pulled toward ground when FETs 121 and 122 are conducting. As known in the art, FETs 121 and 122 are optional. The circuit of FIG. 1 would operate correctly by replacing FETs 121 and 122 with conductors to node 120.

Those skilled in the art would realize the order of connection of some Field Effect Transistors in the input section is immaterial. For example, the circuit would operate similarly if the order of P channel Field Effect Transistors 111 and 112 is reversed. Likewise for the pairs of Field Effect Transistors 113 and 114, 115 and 116, and 117 and 118.

The master latch consisting of clocked inverter 123 and inverter 124 save the state of node 120. The clocking of clocked inverter 123 is of the same sense and FETs 121 and 123. Thus the master latch saves the state of the selected one of Data or $S_{in}$ on a predetermined clock phase.

Slave/output section 130 stores the prior state of the master latch. Pass gate 131 is clocked in the opposite sense of clocked inverter 123, and FETs 121 and 123. On this opposite clock phase the state of the output of inverter 124 is saved in the latch consisting of clocked inverter 132 and inverter 133. This isolation provided by pass gate 131 enables the state of flip-flop 100 to be read from the slave latch while another state is loaded into the master latch during the same clock cycle. The slave latch state is read through a data output terminal at the output of inverter 136 of a $S_{out}$ output terminal at the output of inverter 135.

The two inverters 141 and 142 provide respective inverse signals. Inverter 141 receives the Clk signal at its input and produces the inverse signal ~Clk. Inverter 142 receives the Scan Enable signal at its input and produces the inverse signal ~Scan Enable. These normal and inverse signals are employed in control of flip-flop 100 as illustrated in FIG. 1 and described above.

The circuit illustrated in FIG. 1 is typically embodied in 32 FETs as shown in Table 1:

TABLE 1

| Circuit Element | Number of FETs |
| --- | --- |
| FETs 111 to 118, 121 and 122 | 10 |
| Inverters 124, 133, 134 and 135 | 8 |
| Clocked inverters 123 and 132 | 8 |
| Pass gate 131 | 2 |
| Inverters 141 and 142 | 4 |
| Total | 32 |

Figure 2:
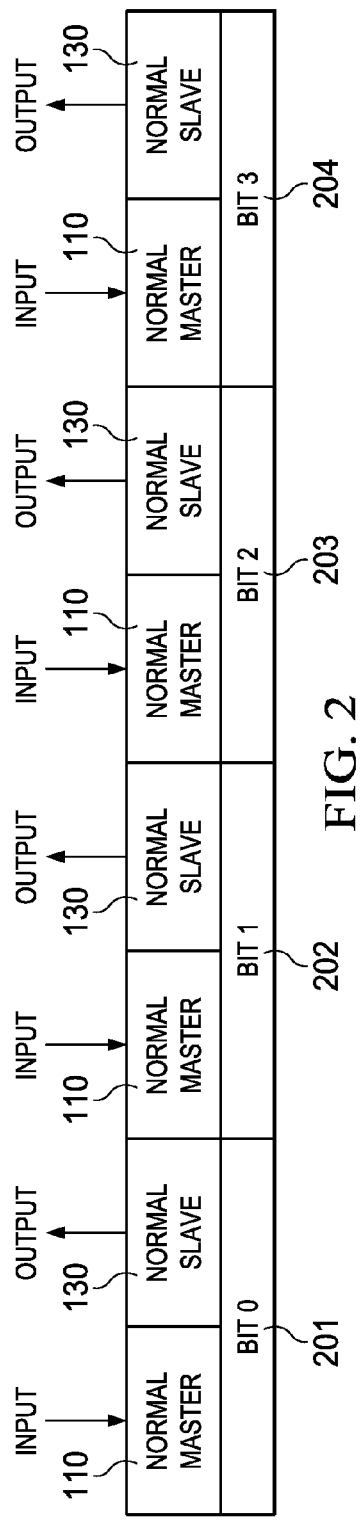
FIG. 2 illustrates the construction of an exemplary 4-bit register from the inverting master-slave flip-flop of FIG. 1.

Flip-flops such as flip-flop 100 are generally deployed in groups of plural bits, such as 32, 64, 128, etc. In the prior art the circuit of FIG. 1 is repeated for every implemented bit. Inverters 141 and 142 serve the same function and may be shared among plural bits. FIG. 2 illustrates an example of a four bit register. Each bit (bit 0 201, bit 1 202, bit 2 203 and bit 3 204) consists of a normal master 110 and a normal slave 130. Each normal master 110 receives the bit input. Each normal slave 130 generates the bit output. If inverters 141 and 142 are shared among the four bit circuits, then the total FETs needed for this four bit example are as shown in Table 2.

TABLE 2

| Circuit Element | Number of FETs |
| --- | --- |
| FETs 111 to 118, 121 and 122 | 4 × 10 = 40 |
| Inverters 124, 133, 134 and 135 | 4 × 8 = 32 |
| Clocked inverters 123 and 132 | 4 × 8 = 32 |
| Pass gate 131 | 4 × 2 = 8 |
| Inverters 141 and 142 | 4 |
| Total | 116 |

This invention exploits the difference in output between the normal mode and the scan mode. In the normal mode the flip-flop outputs typically must drive a relatively long conductor to the use circuit. If the set of flip-flops are used for a CPU register file, each bit output must drive a line to all the functional units that may use the register data. This generally requires a large drive capacity for each output stage. Most other uses of registers similarly require a large driving capacity for the data bit outputs.

This is not the case for the scan mode. As known in the art, serial scan chains permit testing of the circuit under test as follows. Data is loaded into the registers of the circuit under test via the serial scan chains in a scan mode. In the scan mode each scan chain provides a serial path between an input, some of the data registers of the circuit under test and an output. Such an arrangement permits setting the conditions of the circuit under test into a desired state by scanning in the appropriate data. A set of parallel scan chains are generally designed to include registers storing data relevant to the internal condition of the circuit under test. After loading the data in this manner, the circuit under test operates in a normal mode responsive to its own clock signal for an interval. Following this operational interval, the internal state of the circuit under test is output via the same scan chains. This view of the internal state of the circuit under test can be compared with an expected internal state.

This use of memory bits generally uses a different connectivity between bits than the normal mode. Rather than driving a long data pathway, scan chains typically connect to adjacent bits within the same register. This lack of need of large driving capacity enables reduction in the number of FETs required. The large driving capacity of the prior art construction is typically need only on output of the serial chain from the current register to another register file. This would typically be the last flip-flop or bit of the register. Additionally the input section of the master of the first bit of a register will typically need the better sensitivity to the scan chain signal provided connection to a FET gate (normal master 110) than connection to a FET source-drain path (shared master 410).

Figure 3:
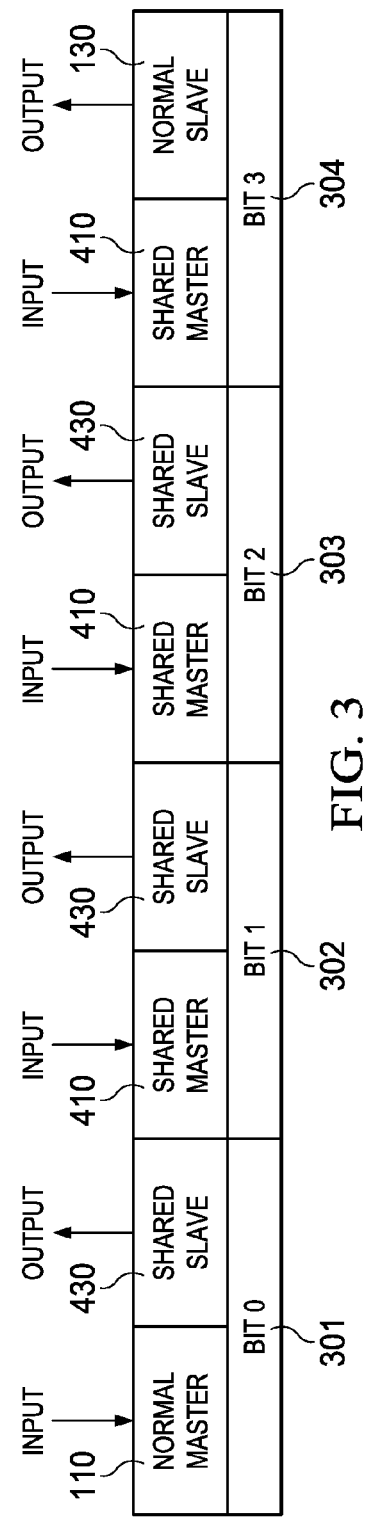
FIG. 3 illustrates the construction of an exemplary 4-bit register according to this invention.

FIG. 3 illustrates an example of a four bit register according to this invention. The first bit, bit 0 201, consists of a normal master 110 and a shared slave 430. Each of bit 1 202 and bit 2 203 consists of a shared master 430 and a shared slave 410. The final bit, bit 3 204, consists of a shared master 410 and a normal slave 130. Normal master 110 and each shared master 410 receive corresponding bit inputs. Each shared slave 430 and normal slave 130 generates a bit output. This is an example of how a register is construction according to this invention. The serial chain includes consecutive bits in the register. A first bit in the register includes a normal master 110 and a shared slave 430. Each intermediate includes a shared master 430 and a shared slave 410. A final bit in the register includes a shared master 410 and a normal slave 130.

Figure 4:
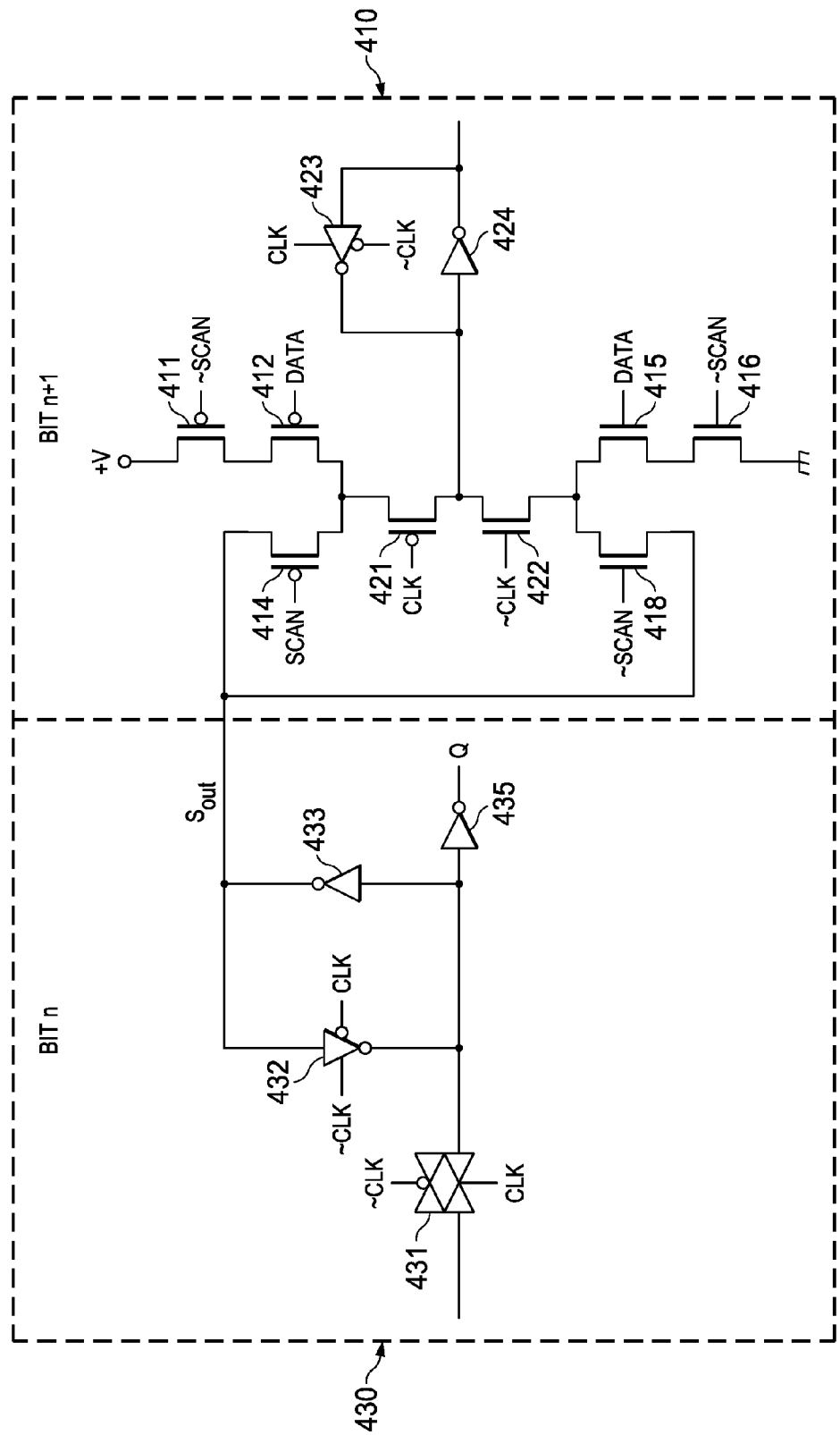
FIG. 4 illustrates the circuits of an inverting master-slave flip-flop having data and scan inputs according to this invention.

FIG. 4 illustrates the details of shared slave 430 from bit n and shared master 410 from bit n+1. These are illustrated as adjacent as would occur crossing the bit boundary between bit n and bit n+1. Shared slave 430 includes: pass gate 431; a slave latch having clocked inverter 432 and inverter 433; and inverter 435. Shared master 410 includes: FETs 411, 412, 414, 415, 416, 419, 421 and 422; clocked inverter 423; and inverter 424. The four bit register of FIG. 3 would also include shared inverters corresponding to inverters 141 and 142 for the inverse Clk and Scan Enable signals (not illustrated in FIG. 4).

The combination of shared slave 430 and shared master 410 differs from normal slave 130 and normal master 110 in the manner the $S_{out}$ output of shared slave 430 is coupled to the $S_{in}$ input of shared master 410. The pair consisting of shared slave 430 and shared master 410 require fewer FETs than the pair consisting of normal slave 130 and normal master 110. The shared slave/shared master combination supplies the $S_{out}$ output directly from the latch consisting of clocked inverter 432 and inverter 433 without a circuit corresponding to inverter 134. In shared master 430 the $S_{out}$ output is supplied to the source-drain paths of FETs 414 and 418. These FETs correspond to respective FETs 104 and 108 of normal master 100. Thus shared master 430 includes no FETs corresponding to FETs 113 and 117.

Table 3 shows the numbers of FETs required for the four-bit register example of FIG. 3.

TABLE 3

| Circuit Element | Number of FETs |
| --- | --- |
| Normal Master<br>FETs 111 to 118, 121 and 122<br>Inverter 124<br>Clocked inverter 123 | 10 + 2 + 4 = 16 |
| Shared Slave<br>Pass gate 431<br>Inverters 433 and 435<br>Clocked inverter 432 | 3 × (2 + 4 + 4) = 30 |
| Shared Master<br>FETs 411, 412, 413, 415, 416,<br>417, 121 and 122<br>Inverter 424<br>Clocked inverter 423 | 3 × (8 + 2 + 4) = 42 |
| Normal Slave<br>Pass gate 131 | 2 + 6 + 4 = 12 |

TABLE 3-continued

| Circuit Element | Number of FETs |
|---|---|
| Inverters 133, 134 and 135 Clocked inverter 132 Inverters 141 and 142 | 4 |
| Total | 104 |

This shows a savings of 12 FETs over the number needed according to the prior art as shown in Table 2. This savings in FETs scales with the register size. A register of N bits which is used in parallel for data reads/writes and used serially for scan chain would employ (N−1)×4 fewer FETs than the prior art. This saving is dependent upon the number of shared masters and shared slaves employed and not on the sharing of the inverse signal inverters. This assumes that the first bit includes a normal master, the last bit includes a normal slave and all other masters and slaves are shared.

Reducing the number of FETs required for this multi-bit register advantageously increases the value of the corresponding integrated circuit. Integrated circuits are manufactured in silicon wafers. The manufacturing cost per silicon wafer is relatively independent of the number of integrated circuits formed. A reduction in the number of required FETs (such as provided by this invention) reduces the area of each integrated circuit and enables more integrated circuits to be formed in the same wafer. Thus the manufacturing cost of each integrated circuit is reduced. As an alternative, the area saved using this invention may be used for other purposes. This could increase the value of the corresponding integrated circuit without increasing manufacturing costs by preserving the same area.

Figure 5:
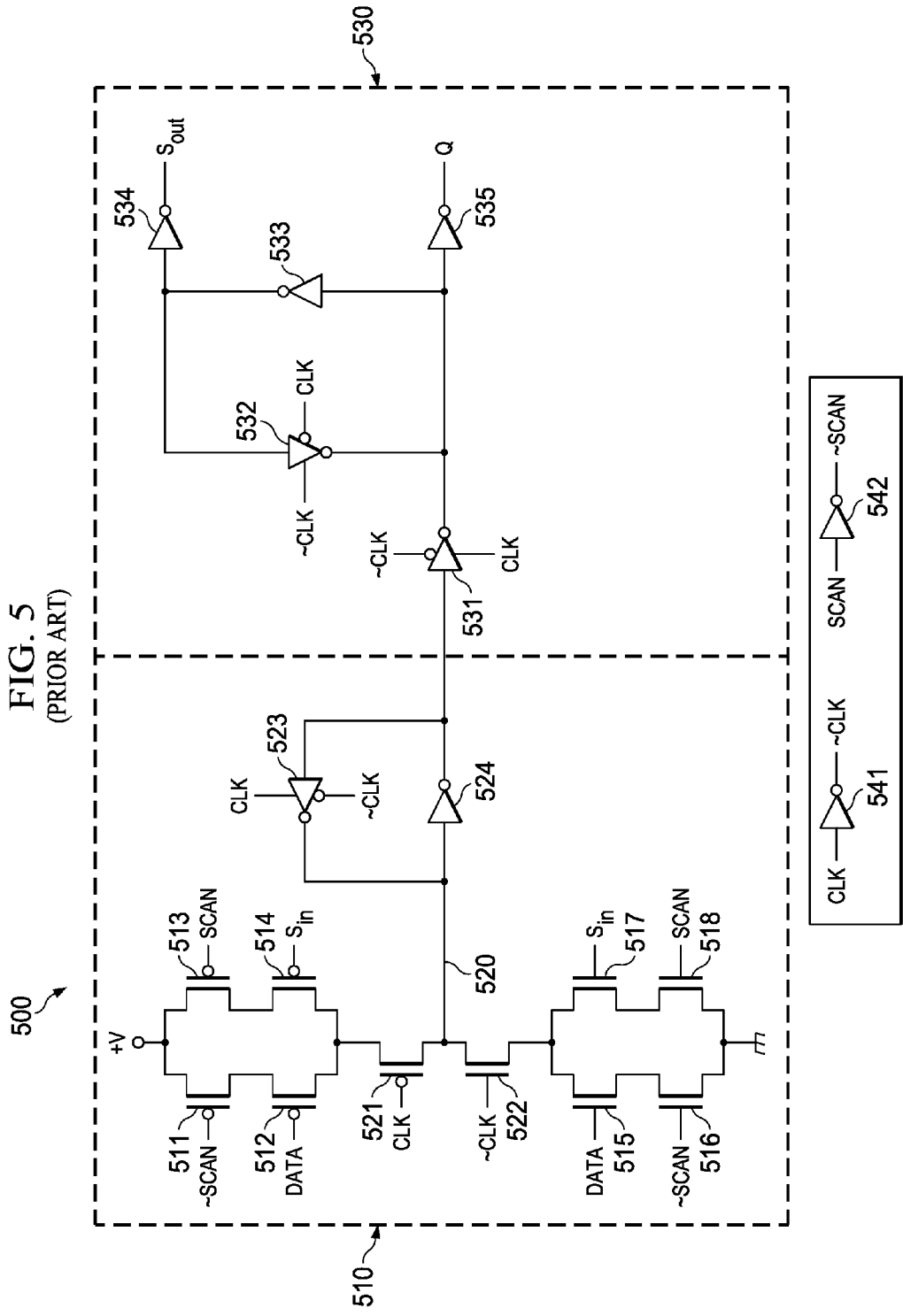
FIG. 5 illustrates the circuits of a prior art non-inverting master-slave flip-flop having data and scan inputs.

FIG. 5 illustrates a prior art non-inverting master-slave flip-flop 500 having data and scan input. Master-slave flip-flop 500 is divided into an input/master section 510 and a slave/output section 530. Input/master section 510 includes: an input section of FETs 511, 512, 513, 514, 515, 516, 517, 518, 521 and 521; and a master latch including clocked inverter 523 and inverter 524. Slave/output section 530 includes: clocked inverter 531; a slave latch having clocked inverter 532 and inverter 533; and an output section including inverters 534 and 535. Inverters 541 and 542, providing respective inverted clock and scan signals, are not part of either input/master section 510 or slave/output section 530. Non-inverting master-slave flip-flop 500 operates similarly to inverting master-slave flip-flop 100 described above except that pass gate 131 is replaced by clocked inverter 531. The total FETs needed for a four bit register using non-inverting master-slave flip-flop 500 are as shown in Table 4.

TABLE 4

| Circuit Element | Number of FETs |
|---|---|
| FETs 511 to 518, 521 and 522 | 4 × 10 = 40 |
| Inverters 524, 533, 534 and 535 | 4 × 8 = 32 |
| Clocked inverters 123, 131 and 132 | 4 × 12 = 48 |
| Inverters 141 and 142 | 4 |
| Total | 124 |

Figure 6:
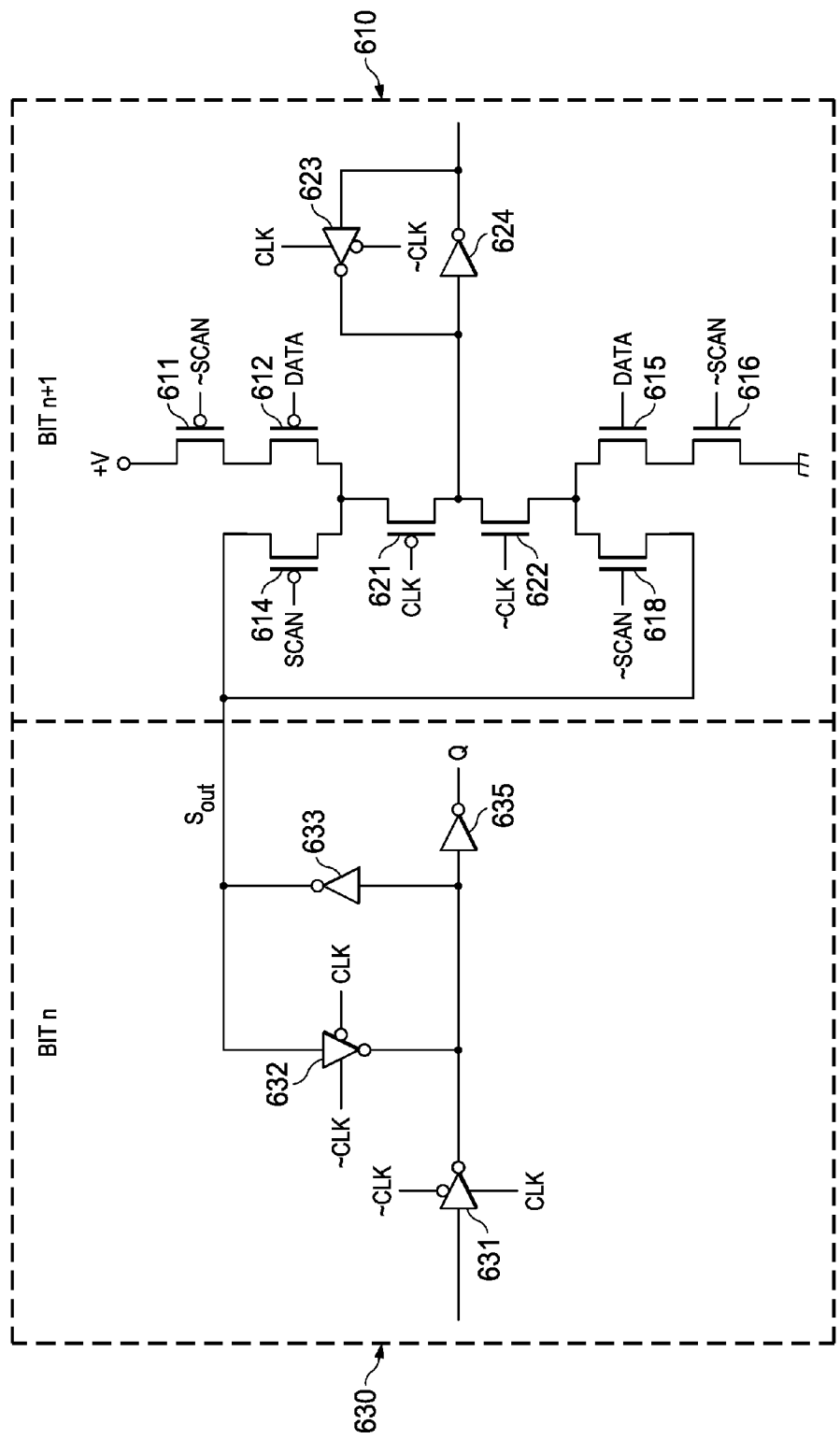
FIG. 6 illustrates the circuits of a non-inverting master-slave flip-flop having data and scan inputs according to this invention.

FIG. 6 illustrates the details of shared slave 630 and shared master 610 used in a non-inverting master-slave flip-flop according to this invention. Similarly to FIG. 4, these are illustrated as adjacent as would occur crossing a bit boundary. Shared slave 630 includes: clocked inverter 631; a slave latch having clocked inverter 632 and inverter 633; and inverter 635. Shared master 610 includes: FETs 611, 612, 614, 615, 616, 619, 621 and 622; clocked inverter 623; and inverter 624. The four bit register of FIG. 3 would also include shared inverters corresponding to inverters 141 and 142 for the inverse Clk and Scan Enable signals (not illustrated in FIG. 4). Non-inverting shared master 610 and shared slave 630 operates similarly to normal master 410 and shared slave 430 described above except that pass gate 431 is replaced by clocked inverter 631. The total FETs needed for a four bit register using shared master 610 and shared slave 630 are as shown in Table 5.

TABLE 5

| Circuit Element | Number of FETs |
|---|---|
| Normal Master FETs 511 to 518, 521 and 522 Inverter 524 Clocked inverter 523 | 10 + 2 + 4 = 16 |
| Shared Slave Clocked inverters 631 and 632 Inverters 633 and 635 | 3 × (8 + 4) = 36 |
| Shared Master FETs 411, 412, 413, 415, 416, 417, 121 and 122 Inverter 424 Clocked inverter 423 | 3 × (8 + 2 + 4) = 42 |
| Normal Slave Clocked inverters 131 and 132 Inverters 133, 134 and 135 Inverters 141 and 142 | 8 + 6 = 14 4 |
| Total | 112 |

Those skilled in the art would understand this invention can be practiced several variations. Each flip-flop may include an additional buffer on the ~Clk signal. The input stages of the master may be implemented with tri-state logic or other mixed logic types. The $S_{out}$ output signal may be taken from the other sense of the slave latch. The master input can include integrated logic functions.

What is claimed is:

1. A multibit register having bitwise accessible data and connected in a serial scan chain comprising:
   a first bit including a normal master and a shared slave;
   a last bit including a shared master and a normal slave;
   each intermediate bit between said first bit and said last bit including a shared master and a shared slave;
   each normal master including
      a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving an inverse Scan Enable signal,
      a second pair of P channel Field Effect Transistors having source-drain channels connected in series between said power supply node and said common node, a first P channel Field Effect Transistor of said second pair having a gate receiving a scan input signal from a prior bit and a second P channel Field Effect Transistor of said second pair having a gate receiving a Scan Enable signal,
      a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal, a second pair of N channel Field Effect Transistors having source-drain channels connected in series between said common node and ground, a first N channel Field Effect Transistor of said second pair having a gate receiving said scan input signal from said prior bit and a second N channel Field Effect Transistor of said second pair having a gate receiving said inverse Scan Enable signal, a first inverter having an input connected to said common node and an output serving as a master latch output, and a second inverter having an input connected to said output of said first inverter and an output connected to said input of said first inverter;

each normal slave including a first inverter having an input connected to said master latch output of a corresponding bit and an output, a second inverter having an input connected to said output of said first inverter and an output, a third inverter having an input connected to said master latch output of a corresponding bit and an output serving as said data output of said corresponding bit, and a fourth inverter having an input connected to said output of said first inverter and an output serving as scan output of said corresponding bit;

each shared master having a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving said inverse Scan Enable signal, a P channel Field Effect Transistor having a source-drain channel connected between a scan output of a prior bit and said common node, and having a gate receiving said Scan Enable signal, a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal, an N channel Field Effect Transistor having a source-drain channel connected between said scan output of a prior bit and ground, and having a gate receiving said inverse Scan Enable signal, a first inverter having an input connected to said common node and an output serving as a master latch output, and a second inverter having an input connected to said output of said first inverter and an output connected to said input of said first inverter;

each shared slave including a first inverter having an input connected to said master latch output of a corresponding bit and an output serving as scan output of said corresponding bit, a second inverter having an input connected to said output of said first inverter and an output, and a third inverter having an input connected to said master latch output of a corresponding bit and an output serving as said data output of said corresponding bit; and a Scan Enable inverter connected to said normal master and each shared master having an input receiving a Scan Enable signal and an output generating an inverse Scan Enable supplied to said normal master and each shared master.

2. The multibit register of claim 1, wherein:

each normal master further including a clock P channel Field Effect Transistor having a source-drain channel forming a connection between said source-drain channels of said first pair of P channel Field Effect Transistors and said second pair of P channel Field Effect Transistors, and said common node and a gate receiving a clock signal;

a clock N channel Field Effect Transistor having a source-drain channel forming a connection between said source-drain channels of said third pair of N channel Field Effect Transistors and said second pair of P channel Field Effect Transistors, and said common node and a gate receiving an inverse clock signal; and said multibit register further comprises a clock signal inverter having an input receiving a clock signal and an output connected to said gate of said clock N channel Field Effect Transistor generating said inverse clock signal.

3. The multibit register of claim 1, wherein:

said second inverter of said normal master comprises a clocked inverter receiving a clock signal and an inverse clock signal; and wherein the multibit register further comprises a clock signal inverter having an input receiving a clock signal and an output connected to said second inverter of said normal master generating said inverse clock signal.

4. The multibit register of claim 1, wherein:

each shared master further including a clock P channel Field Effect Transistor having a source-drain channel forming a connection between said source-drain channels of said first pair of P channel Field Effect Transistors and said second pair of P channel Field Effect Transistors, and said common node and a gate receiving a clock signal;

a clock N channel Field Effect Transistor having a source-drain channel forming a connection between said source-drain channels of said third pair of N channel Field Effect Transistors and said second pair of P channel Field Effect Transistors, and said common node and a gate receiving an inverse clock signal; and said multibit register further comprises a clock signal inverter having an input receiving a clock signal and an output connected to said gate of said clock N channel Field Effect Transistor generating said inverse clock signal.

5. The multibit register of claim 1, wherein:

said second inverter of each shared master comprises a clocked inverter receiving a clock signal and an inverse clock signal; and wherein the multibit register further comprises a clock signal inverter having an input receiving a clock signal and an output connected to said second inverter of each shared master generating said inverse clock signal.

6. The multibit register of claim 1, wherein:
said normal slave further comprises a pass gate serving as connection between said master latch output and said input of said first inverter; and
wherein the multibit register further comprises a clock signal inverter having an input receiving said clock signal and an output connected to said pass gate of said normal slave generating said inverse clock signal.

7. The multibit register of claim 1, wherein:
said normal slave further comprises a clocked inverter serving as connection between said master latch output and said input of said first inverter; and
wherein the multibit register further comprises a clock signal inverter having an input receiving said clock signal and an output connected to said clocked inverter of said normal slave generating said inverse clock signal.

8. The multibit register of claim 1, wherein:
said second inverter of said normal slave comprises a clocked inverter receiving a clock signal and an inverse clock signal; and
wherein the multibit register further comprises a clock signal inverter having an input receiving a clock signal and an output connected to said second inverter of each shared master generating said inverse clock signal.

9. The multibit register of claim 1, wherein:
each shared slave further comprises a pass gate serving as connection between said master latch output and said input of said first inverter; and
wherein the multibit register further comprises a clock signal inverter having an input receiving said clock signal and an output connected to said pass gate of said normal slave generating said inverse clock signal.

10. The multibit register of claim 1, wherein:
each slave further comprises a clocked inverter serving as connection between said master latch output and said input of said first inverter; and
wherein the multibit register further comprises a clock signal inverter having an input receiving said clock signal and an output connected to said clocked inverter of said normal slave generating said inverse clock signal.

11. The multibit register of claim 1, wherein:
said second inverter of each shared slave comprises a clocked inverter receiving a clock signal and an inverse clock signal; and
wherein the multibit register further comprises a clock signal inverter having an input receiving a clock signal and an output connected to said second inverter of each shared master generating said inverse clock signal.

12. A multibit register having bitwise accessible data and connected in a serial scan chain comprising:
a first bit including
an input section having
a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving an inverse Scan Enable signal,
a second pair of P channel Field Effect Transistors having source-drain channels connected in series between said power supply node and said common node, a first P channel Field Effect Transistor of said second pair having a gate receiving a scan input signal from a prior bit and a second P channel Field Effect Transistor of said second pair having a gate receiving a Scan Enable signal,
a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal,
a second pair of N channel Field Effect Transistors having source-drain channels connected in series between said common node and ground, a first N channel Field Effect Transistor of said second pair having a gate receiving said scan input signal from said prior bit and a second N channel Field Effect Transistor of said second pair having a gate receiving said inverse Scan Enable signal, and
an output section having
a first inverter having an input connected to said master latch output of a corresponding bit and an output serving as scan output of said corresponding bit,
a second inverter having an input connected to said output of said first inverter and an output, and
a third inverter having an input connected to said master latch output of a corresponding bit and an output serving as said data output of said corresponding bit;
at least one intermediate bit including
an input section having
a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving said inverse Scan Enable signal,
a P channel Field Effect Transistor having a source-drain channel connected between a scan output of a prior bit and said common node, and having a gate receiving said Scan Enable signal,
a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal,
an N channel Field Effect Transistor having a source-drain channel connected between said scan output of a prior bit and ground, and having a gate receiving said inverse Scan Enable signal,
an output section having
a first inverter having an input connected to said master latch output of a corresponding bit and an output serving as scan output of said corresponding bit,
a second inverter having an input connected to said output of said first inverter and an output, and
a third inverter having an input connected to said master latch output of a corresponding bit and an output serving as said data output of said corresponding bit; and a last bit having
an input section having
a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving said inverse Scan Enable signal,
a P channel Field Effect Transistor having a source-drain channel connected between a scan output of a prior bit and said common node, and having a gate receiving said Scan Enable signal,
a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal,
an N channel Field Effect Transistor having a source-drain channel connected between said scan output of a prior bit and ground, and having a gate receiving said inverse Scan Enable signal, and an output section having
a first inverter having an input connected to said master latch output of a corresponding bit and an output,
a second inverter having an input connected to said output of said first inverter and an output,
a third inverter having an input connected to said master latch output of a corresponding bit and an output serving as said data output of said corresponding bit, and
a fourth inverter having an input connected to said output of said first inverter and an output serving as scan output of said corresponding bit; and
a Scan Enable inverter connected to said input section of said first bit, each intermediate bit and said last bit having an input receiving a Scan Enable signal and an output generating an inverse Scan Enable supplied to said input section of said first bit, each intermediate bit and said last bit.

13. A multibit register having bitwise accessible data and connected in a serial scan chain comprising:
an nth bit including an output section having
a first inverter having an input connected to said master latch output of said nth bit and an output serving as scan output of said nth bit,
a second inverter having an input connected to said output of said first inverter and an output, and
a third inverter having an input connected to master latch output of said nth bit and an output serving as said data output of said nth bit;
an (n+1)th bit immediately following said nth including an input section having
a first pair of P channel Field Effect Transistors having source-drain channels connected in series between a power supply node and a common node, a first P channel Field Effect Transistor of said first pair having a gate receiving a data signal for the corresponding bit and a second P channel Field Effect Transistor of said first pair having a gate receiving said inverse Scan Enable signal,
a P channel Field Effect Transistor having a source-drain channel connected between a scan output of said nth bit and said common node, and having a gate receiving said Scan Enable signal,
a first pair of N channel Field Effect Transistors having source-drain channels connected in series between said common node and ground, a first N channel Field Effect Transistor of said first pair having a gate receiving said data signal for said corresponding bit and a second N channel Field Effect Transistor of said first pair having a gate receiving said inverse Scan Enable signal,
an N channel Field Effect Transistor having a source-drain channel connected between said scan output of said nth bit and ground, and having a gate receiving said inverse Scan Enable signal.

* * * * *